United States Patent
Gu et al.

(10) Patent No.: US 8,163,641 B2
(45) Date of Patent: *Apr. 24, 2012

(54) SYSTEM FOR MODIFYING SMALL STRUCTURES

(75) Inventors: George Y. Gu, Burlington, MA (US); Neil J. Bassom, Hamilton, MA (US); Thomas J. Gannon, West Newbury, MA (US); Kun Liu, Peabody, MA (US)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/695,808

(22) Filed: Jan. 28, 2010

(65) Prior Publication Data

US 2010/0151679 A1 Jun. 17, 2010

Related U.S. Application Data

(62) Division of application No. 11/081,934, filed on Mar. 16, 2005, now Pat. No. 7,674,706.

(60) Provisional application No. 60/561,701, filed on Apr. 13, 2004.

(51) Int. Cl.
*H01L 21/4763* (2006.01)

(52) U.S. Cl. .......... 438/596; 438/614; 205/80; 427/436; 257/E21.174

(58) Field of Classification Search .................. 438/584, 438/598, 599, 600, 614, 618, 637, 641, 662; 205/80, 109, 118; 427/436, 437; 257/E21.174, 257/E21.175, E21.479

See application file for complete search history.

(56) References Cited

U.S. PATENT DOCUMENTS

| 3,408,274 A | 10/1968 | Hoffman |
| 3,705,060 A | 12/1972 | Stork |
| 4,876,112 A | 10/1989 | Kaito et al. |
| 4,925,755 A | 5/1990 | Yamaguchi et al. |
| 4,952,290 A * | 8/1990 | Carnarius et al. ............... 205/99 |
| 5,026,664 A | 6/1991 | Hongo et al. |
| 5,104,684 A | 4/1992 | Tao et al. |
| 5,827,786 A | 10/1998 | Puretz |
| 6,319,831 B1 | 11/2001 | Tsai et al. |

(Continued)

FOREIGN PATENT DOCUMENTS

JP 07-18452 1/1995

(Continued)

OTHER PUBLICATIONS

Andricacos, P.C. et al., "Damascene Copper Electroplating for Chip Interconnections," IBM J. Res. Develop., Sep. 1998, pp. 567-574, vol. 42, No. 5.

(Continued)

*Primary Examiner* — William D Coleman
*Assistant Examiner* — Su Kim
(74) *Attorney, Agent, or Firm* — Scheinberg & Griner, LLP; Michael O. Scheinberg; David Griner

(57) ABSTRACT

A charge transfer mechanism is used to locally deposit or remove material for a small structure. A local electrochemical cell is created without having to immerse the entire work piece in a bath. The charge transfer mechanism can be used together with a charged particle beam or laser system to modify small structures, such as integrated circuits or microelectromechanical system. The charge transfer process can be performed in air or, in some embodiments, in a vacuum chamber.

18 Claims, 20 Drawing Sheets

U.S. PATENT DOCUMENTS

| | | | |
|---|---|---|---|
| 6,365,896 B1 | 4/2002 | van der Mast | |
| 6,605,539 B2 | 8/2003 | Lee et al. | |
| 6,667,530 B2 | 12/2003 | Toyoda | |
| 6,693,358 B2 | 2/2004 | Yamada et al. | |
| 6,696,360 B2 | 2/2004 | Ahn et al. | |
| 6,720,248 B2 | 4/2004 | Ryo | |
| 6,858,530 B2 | 2/2005 | Kane et al. | |
| 6,913,681 B2 * | 7/2005 | Matsuda et al. | 205/117 |
| 6,923,892 B2 | 8/2005 | Tatsuura et al. | |
| 6,974,768 B1 | 12/2005 | Kailasam | |
| 7,087,927 B1 | 8/2006 | Weaver et al. | |
| 2002/0006357 A1 | 1/2002 | McGeoch et al. | |
| 2002/0074494 A1 * | 6/2002 | Lundquist et al. | 250/307 |
| 2003/0121778 A1 | 7/2003 | Dodgson et al. | |
| 2004/0148766 A1 | 8/2004 | Noguchi et al. | |

FOREIGN PATENT DOCUMENTS

JP     08-139099     5/1996

OTHER PUBLICATIONS

Circuit Technology Center, Guidebook—A Comprehensive Resource for Circuit Board Rework and Repair, 4.6.3 Edge Contact Repair/Rework, Plating Method, Jul. 7, 2000, www.circuittechctr.com/guides/4-6-3.stml (8 pages).

Li, D.X., et al., 'The Characterization of Nb-Al2O3 and Nb-MgO Interfaces in MBE Grown Nb-MgO-Nb-Al2O3 Multilayers,' Acta Metall. Mater., 1992, pp. S237-S247, vol. 40.

Suryavanshi, Abhijit P., 'Probe-based Electrochemical Fabrication of Freestanding Cu Nanowire Array,' Applied Physics Letters, 2006, 3 pages, vol. 88.

* cited by examiner

SYSTEM FOR MODIFYING SMALL STRUCTURES

This application is a divisional application of U.S. patent application Ser. No. 11/081,934, filed on Mar. 16, 2005, which claims priority from U.S. Provisional Patent Application No. 60/561,701, filed Apr. 13, 2004, all of which are hereby incorporated by reference.

TECHNICAL FIELD OF THE INVENTION

The present invention relates to modifying small structures and is particularly useful in the field of nanotechnology, such as in integrated circuit fabrication and repair.

BACKGROUND OF THE INVENTION

Semiconductor devices such as microprocessors can be made up of millions of transistors, each interconnected by thin metallic lines branching on several levels and electrically isolated from each other by layers of insulating materials. When a new semiconductor design is first produced in a semiconductor fabrication facility, the design typically does not operate exactly as expected. It is then necessary for the engineers who designed the device to review their design and "rewire" it to achieve the desired functionality. Due to the complexity of building a semiconductor device in a semiconductor fabrication facility, it typically takes weeks or months to have the re-designed device produced. Further, the changes implemented frequently do not solve the problem, or the changes expose another flaw in the design. The process of testing, re-designing and re-fabrication can significantly lengthen the time to market new semiconductor devices. Circuit editing—the process of modifying a circuit during its development without having to remanufacture the whole circuit—provides tremendous economic benefits by reducing both processing costs and development cycle times.

Focused ion beams (FIBs) are often used to edit integrated circuits. FIBs can be focused to a spot smaller than one tenth of a micron. Because of their small beam spot size, focused ion beam systems are used to create and alter microscopic structures. Focused ion beams can micro-machine material by sputtering or etching, that is, physically knocking atoms or molecules from the target surface. Focused ion beams can also be used to deposit material, using a precursor gas that adheres to the specimen surface and decomposes in the presence of the ion beam to leave a deposit on the surface. FIB systems are widely used in circuit editing to deposit new metallic paths to create new connections and to remove metallic paths to eliminate existing connections. Using a FIB system to alter a circuit allows a circuit designer to test variations of the circuit without undertaking the lengthy process of modifying the photolithography masks and fabricating a new circuit from scratch.

To deposit a conductive path using a FIB system, the system operator directs a jet of precursor gas, typically an organometallic compound such as tungsten hexacarbonyl, to the surface of the specimen while a focused ion beam scans the area upon which the conductor is to be deposited. A metallic layer is deposited only in the area impacted by the beam, so the shape of the deposited metal can be precisely controlled. An ion beam assisted deposition process is described, for example, in U.S. Pat. No. 4,876,112 to Kaito et al. for a "Process for Forming Metallic Patterned Film" and U.S. Pat. No. 5,104,684 to Tao et al. for "Ion Beam Induced Deposition of Metals."

During circuit editing, it is sometimes necessary to fill a "via," that is, a hole between different levels of the circuit board. When the hole has a high aspect ratio, that is, the hole is deep and narrow, the FIB deposition process has difficulty filling the bottom of the hole and can leave voids in the deposited material. Voids increase resistance and are conducive to corrosion. It is also sometimes necessary to cut metal lines that are buried under layers of insulation. To cut the buried line, it is necessary to mill a small diameter via to expose the line without damaging neighboring devices, and then to cut the line through the via.

Use of an ion beam process to deposit an insulating material is also known. An electrically insulating material may be deposited, for example, before depositing a conductive path to prevent the new conductive path from electrically contacting an existing conductor. U.S. Pat. No. 5,827,786 to Puretz for "Charged Particle Deposition of Electrically Insulating Films" describes a procedure for depositing an electrically insulating material.

Current FIB tungsten and platinum depositions typically have resistivities greater than about 150 micro ohm centimeters ($\mu\Omega$-cm). Recently-introduced FIB copper depositions have resistivities of 30-50 $\mu\Omega$-cm. This is significantly higher that the resistivity of a pure metal, such as copper, which is less than 5 $\mu\Omega$-cm. As conductor sizes continue to shrink and processor speeds increase, it will be necessary to reduce the resistivity of conductors deposited during the circuit edit process, so that the smaller conductors can still carry the required current. Similarly, the resistivity of material used to fill vias will need to decrease because the diameter of vias will decrease in the future so there is less conductive material in the hole to carry current. Low resistivity of the fill material and elimination of voids thus becomes even more important. Also, as via dimensions decrease it also becomes more difficult to cleanly sever a line at the bottom of the via without redepositing conductive material on the sidewalls of the via, which can short circuit other layers.

Another challenge in circuit editing is knowing when to stop a milling process. In the case of milling intended to sever a conductor, milling must stop before the layer under the conductor is damaged. The determination of the proper stopping or end point is referred to as "endpointing." Most endpointing techniques determine when a new layer has been exposed by detecting a change in an image formed by the secondary particle current emitted as the beam impacts the work piece. When the material impacted by the beam changes because the beam has broken through one level, there is a sudden change in quantity and type of the secondary particles, and the appearance area in the image changes, for example, from light to dark or vice versa. As modern integrated circuits use smaller and smaller conductors and multiple layers of those conductors are separated by insulating layers, it is necessary that the holes milled by a focused ion beam to access buried conductors have a very small diameter to avoid damaging other conductors in intermediate layers.

As the aspect ratio increases, the secondary particles ejected by the ion beam are increasingly blocked by the walls of the hole and do not reach the detector. As the width of the access hole shrinks and the depth becomes greater, the secondary particle signal becomes exceedingly small and can be lost in the noise of the system, obscuring the end point information. The accuracy requirements for endpointing are getting stricter because the reduction in line thickness means there is less time to stop before the line is milled through. At the same time, the signal strength on which endpointing is typically based is decreasing due to both feature size reduction and the need for higher aspect ratio access holes. Thus, improved endpointing techniques are required for editing modern integrated circuits.

Processes for applying metal globally to a circuit are known. For example, copper electroplating has been used by IC manufactures to make on-chip interconnection in the Damascene process, originally developed by IBM in 1997. The electroplating bath solutions are specially formulated by and commercially available from various semiconductor chemical supplier companies for differently structured ICs. The IC manufacturing electroplating technology, known as superfilling has the capability of filling vias of ~100 nm (1:5 aspect-ratio) during chip manufacturing. Such processes, however, are applied globally to an entire chip.

SUMMARY OF THE INVENTION

It is an object of the invention, therefore, to provide a method for using localized charge transfer mechanism for altering a microscopic structure, and in particular, to provide a method for selectively depositing conductive material onto, or removing material from, a microscopic structure, such as an integrated circuit or an micro-electromechanical device.

In some embodiments, the invention can rapidly and precisely deposit relatively pure, low resistance metal conductors or rapidly remove metals from a structure. In some preferred embodiments, a beam, such as a laser or a charged particle beam, is used together with the local electrochemical processing. The beam can be used to provide access to one or more buried features, and then an electrochemical process, such as electrodeposition or electroetching, can be used to deposit or remove material in a hole or on a surface. The beam can also be used to deposit a local seed layer of any desired shape on which material is then electrodeposited. The beam can also be used to deposit an insulating material to protect existing conductive structures by preventing them from participating in the electrochemical reaction. In some embodiments, a charged particle beam can also be used as a source of current for the electrochemical reaction.

In preferred embodiments, a heterogeneous charge transfer mechanism is used to deposit or etch material. The charge can be transferred though various media, such as through a liquid solution, or ionic liquid, or through a polymer or other solid electrolytes. In various embodiments, the invention can be used for depositing or removing conductors, polymers, and other materials through a charge transfer mechanism.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF PREFERRED EMBODIMENTS

Figure 1:
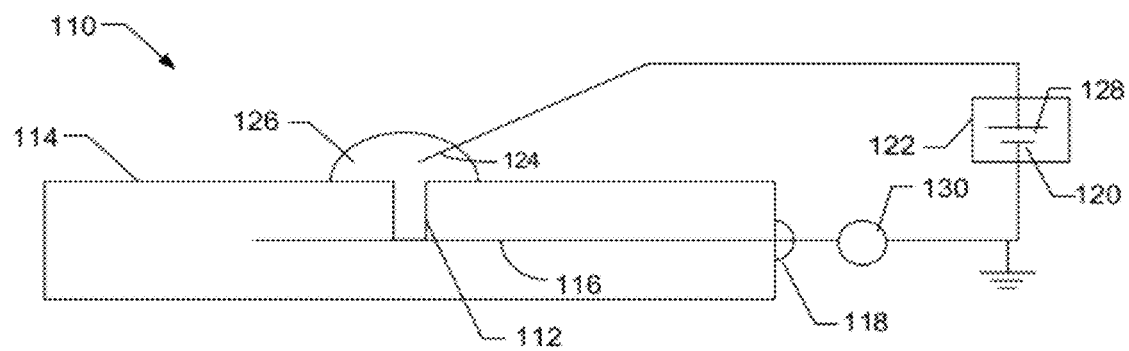
FIG. 1 shows a basic electrochemical circuit used in an embodiment of the present invention.

Several preferred embodiments of the invention are applicable to the field of "circuit editing," that is, adding or removing electrical paths to change the connections in an integrated circuit by a heterogeneous electron charge transfer mechanism, such as electrodepositing or electroetching. In particular, the invention is useful for filling vias, severing metallic lines through high-aspect ratio vias, and rapidly creating conductive lines.

Some embodiments of the invention can be used to deposit metals that are substantially pure. Metals deposited in accordance with the invention can have resistivities that are forty or more times lower than the resistivities of existing FIB-deposited tungsten and platinum materials, and ten times lower than the resistivity of FIB-deposited copper conductive materials.

In some embodiments, the invention can be practiced in air, outside a vacuum chamber. In other embodiments, the invention can be practiced within a vacuum chamber used for charged particle beam processing. Some embodiments that are practiced within a vacuum chamber use an electrolyte having low or negligible vapor pressure, such an ionic liquid or a solid. Some embodiments having a charged particle beam system use a system that accommodates a higher vapor pressure electrolyte, such as an ESEM® low vacuum SEM from FEI Company, the assignee of the present invention. Such embodiments can use an electrolyte having a higher vapor pressure, including more common aqueous electrolytes.

Electrodeposition and electroetching require a complete electric circuit. Typically, conductors within the work piece form part of the circuit. For example, if the work piece is an integrated circuit, part of the electrochemical circuit can occur through the conductive layers of the circuit using the circuit's pins or probe touching part of a conductive layer for external connections. The other portion of the circuit can be provided by a wire or probe inserted into the electrolyte. In embodiments that are performed in a charged particle beam system, part of the circuit can be provided by the charged particle beam, which can induce charge transfer reaction. For example, an ion beam, such as a beam of gallium, argon, or other ions, can induce anodic reactions for deposition. An electron beam can supply negative charges to induce cathodic reactions for etching.

In the case of an electron beam, varying the primary beam energy in the presence of chemicals may induce either anodic or cathodic reactions. At lower energies, each electron in an electron beam can cause the removal of more than one electron from the species in the anodic region, resulting in a net flow of positive charges into the substrate. Thus, the electron beam may be used to electrodeposit material by providing a net positive charge or to etch material by providing a net negative charge. Using an embodiment suitable for use within a charged particle beam vacuum chamber allows steps that require charged particle beam processing and steps that require electrochemical processing to be performed without repeatedly moving the work piece into and out of a vacuum chamber. Such embodiments eliminate the time consuming steps of moving the work piece in and out of the vacuum chamber and pumping down the vacuum chamber to an adequate vacuum between process steps. Also, maintaining the work piece within a vacuum chamber reduces contamination.

Electrochemical reactions typically require a conductive surface on which to deposit or etch so that the required electrical current can be readily supplied. In some applications, for plating onto an existing conductor or etching an existing conductor, a conductive surface exists before processing. In other embodiments, it is required or desirable to deposit a layer of conducting material onto the surface by another process before performing the electrochemical reaction. Such a layer is referred to as a "seed" layer. For example, a seed layer of any desired shape can be precisely deposited by FIB deposition with great accuracy using deposition processes described in the patents referenced above. A precursor gas suitable for FIB deposition of a copper seed layer is hexafluoroacetylacetonato Cu(I) trimethyl vinyl silane (CAS 139566-53-3). Thus, a focused ion beam can be used to deposit a conductive seed layer in a desired pattern, and then the electrochemical process can be used to deposit a lower resistivity, purer metallic layer on top of the FIB deposited layer. An electron beam can also be used to deposit material.

Thus, the charged particle beam, which can be finely focused and tightly controlled, can selectively and precisely define the shape of the conductor to be deposited, and then the relatively unselective electrochemical process can deposit a low resistivity conductor onto the areas defined by the charged particle beam. The electrochemical deposition may be required, for example, because the charged particle beam-deposited material may have too high a resistivity. A seed layer can also be deposited using chemical vapor deposition.

Because any conductive area within the electrochemical circuit and covered by the electrolyte will be affected by the electrochemical reaction, it is necessary to provide a barrier which insulates any exposed conductive area within the circuit that is to remain unaffected. A local insulating layer can be deposited using FIB deposition, chemical vapor deposition, or another process. The electrochemical process will not deposit or etch the work piece where protected by an insulating layer.

FIG. 1 shows schematically a basic electrochemical system that can be used to implement the invention. As shown, system 110 is used to a fill a via 112 in an integrated circuit 114. Via 112 terminates at a conductive layer 116 within integrated circuit 114. Conductive layer 116 is connected through the chip input/output pads or pins 118 to the negative terminal, cathode 120, of a current supply 122, which provides a net DC voltage across the plating circuit. An electrolyte 126, typically a liquid, is applied into the via 112 and electrically connected by way of a wire 124 to the positive terminal, 128, of power supply 122. The electrolyte can be, for example, a copper plating solution. Skilled persons will understand that the polarity shown in FIG. 1 can be reversed to produce etching instead of deposition. A current meter 130 measures the current flowing through the electrochemical circuit.

Figure 2:
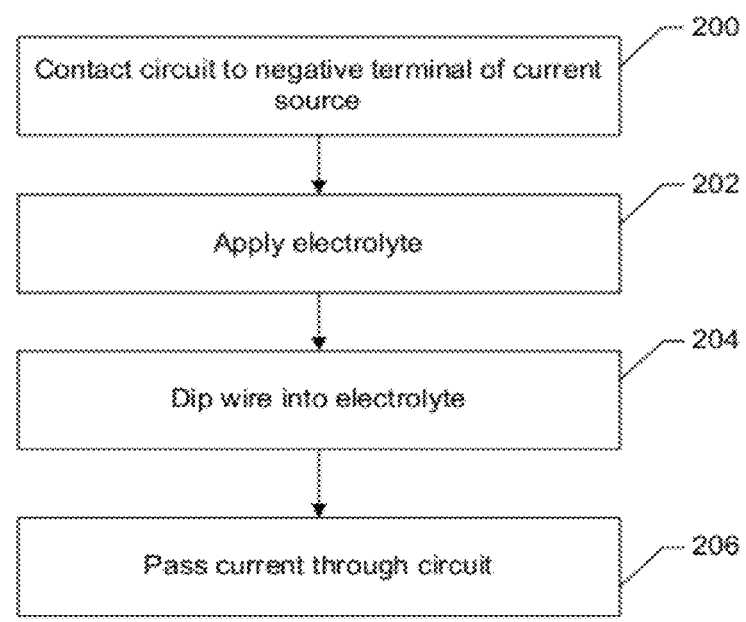
FIG. 2 is a flow chart showing the operation of the circuit in FIG. 1

FIG. 2 shows the steps for using the apparatus of FIG. 1 to electroplate an exposed area of copper or other conductive material. The method of FIG. 2 can be performed in air; no vacuum is required. Some embodiments can be used in a high or low vacuum. In step 200 the copper is connected to the anode 128 of direct current supply 122. In an integrated circuit, copper lines in conductive layer 116 are typically either connected to ground, to power lines, or are separated from the ground or power lines via transistors. Contact to any line can be made either directly from a pin 118 or indirectly by applying the correct inputs to the devices. Netlist information, that is, circuit design information that describes the connections between components of the circuit, can be used to identify the correct input to apply. A connection to cathode 120 can also be made by contacting a conductive probe directly or indirectly to the conductive layer 116, for example, through another via.

In step 202, a small drop, typically having a diameter of 0.5 mm to 1 mm or smaller (about 1 µL), of electrolyte, such as a copper plating solution, is deposited via drop pipette, microsyringe, or similar applicator device over the region that includes the feature to be worked. Because the electrolyte is applied locally to plate a small area, no electroplating bath is needed. Most of the workpiece remains dry. The specific solution used will depend on the application; many electroplating solutions are known in the art. For example, one suitable solution comprises ENTHONE ViaForm® Make-up LA, to which is added 5 ml/L of ENTHONE ViaForm® Accelerator and 2 ml/L ENTHONE ViaForm® Suppressor. The ENTHONE ViaForm® solutions are available from Enthone, Inc., West Haven, Conn.

In step 204, a thin conductor, such as a copper wire, is dipped into the solution to serve as an anode. The wire could be placed using a micromanipulator.

In step 206, a current is passed through the electrochemical cell, resulting in the removal of metal ions from the solution and, in some embodiments from the anode wire, and the deposition of the metal onto the cathode surface, that is, onto conductor 116. Currents on the order of nanoamps fill typically-sized vias within a few minutes. The amount of material deposited is proportional to the charge passed, obeying Faraday's law. The optimum current allows for a fast but controllable deposition and can be readily determined through experimentation for a particular application. When etching a work piece, any metal can be used for the cathode. Also when depositing, any metal can be used as the anode, although the voltage required to maintain a specified current will vary depending on the metal used.

Figure 3:
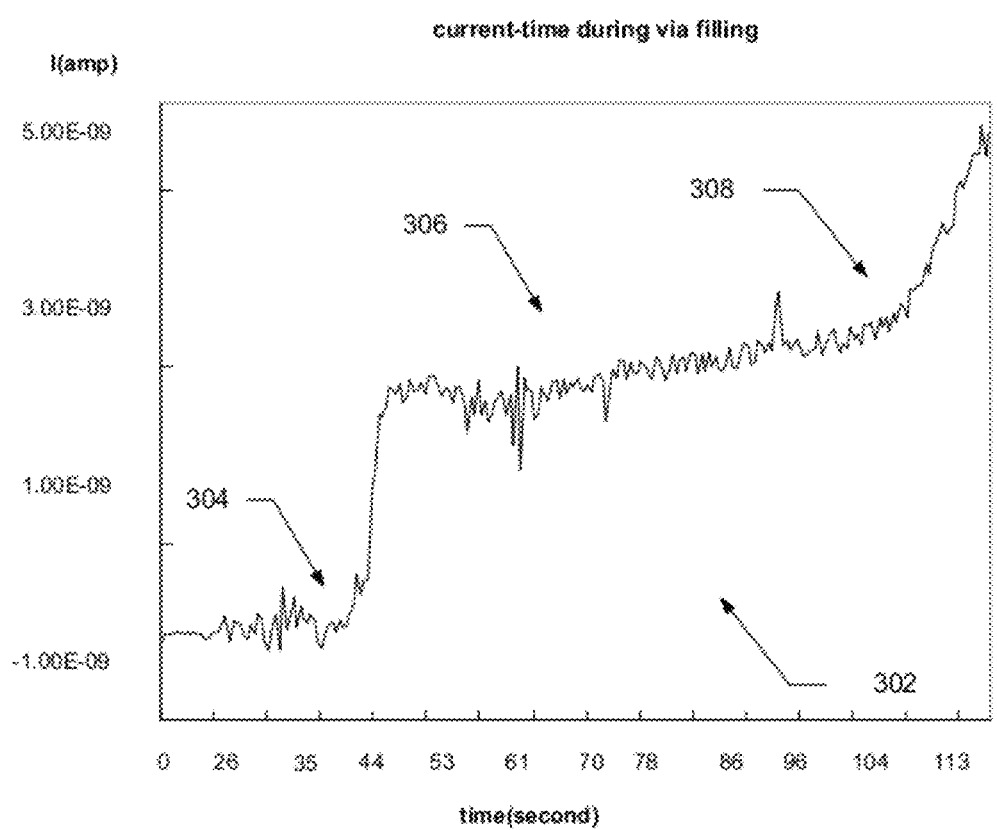
FIG. 3 shows of a graph of current versus time for a process in which a via is filled in accordance with an embodiment of the invention.

The current flowing in the circuit will depend on the area of exposed metal. FIG. 3 shows a graph 302 of current versus time for the process of filling vias. Plating begins around second 44, indicated by reference number 304. While the vias are filling, the current increases, relatively gradually in the region indicated by reference number 306. After the vias are filled, the current increases rapidly, indicated by reference number 308, as metal is deposited onto the work piece surface over the via. By observing the changes in the current during processing, one can determine when the via has been filled. Similarly, when electro-etching, the current will vary with the progress of the etching process, and a user can determine when to stop etching by observing the change in current over time.

Figure 4:
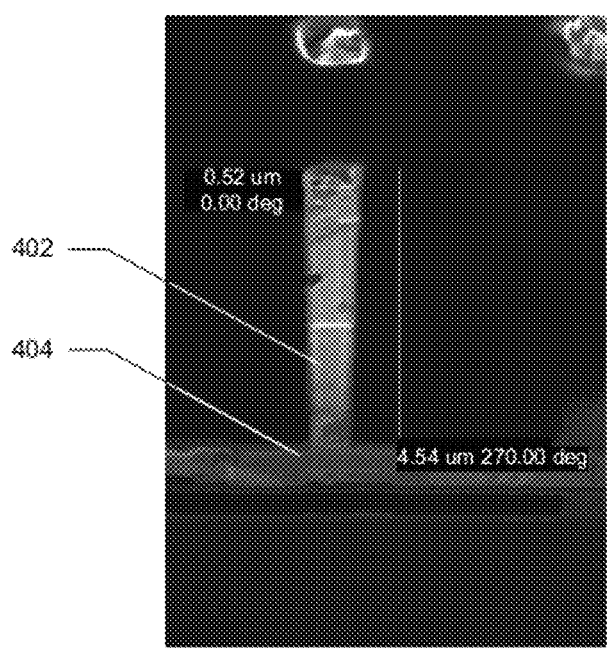
FIG. 4 shows copper deposited in a via in accordance with an embodiment of the invention.

FIG. 4 shows copper deposited in a via by the method described in FIG. 2 to contact buried conductor 404. FIG. 4 shows a via 402 having a width of 0.52 μm and a depth of 4.54 μm filled with a high quality copper-containing material having a resistivity of 4.9 μΩ-cm, approximately three times that of bulk copper. The large grain size visible in FIG. 4 is indicative of very low resistance and high copper content.

Figure 5:
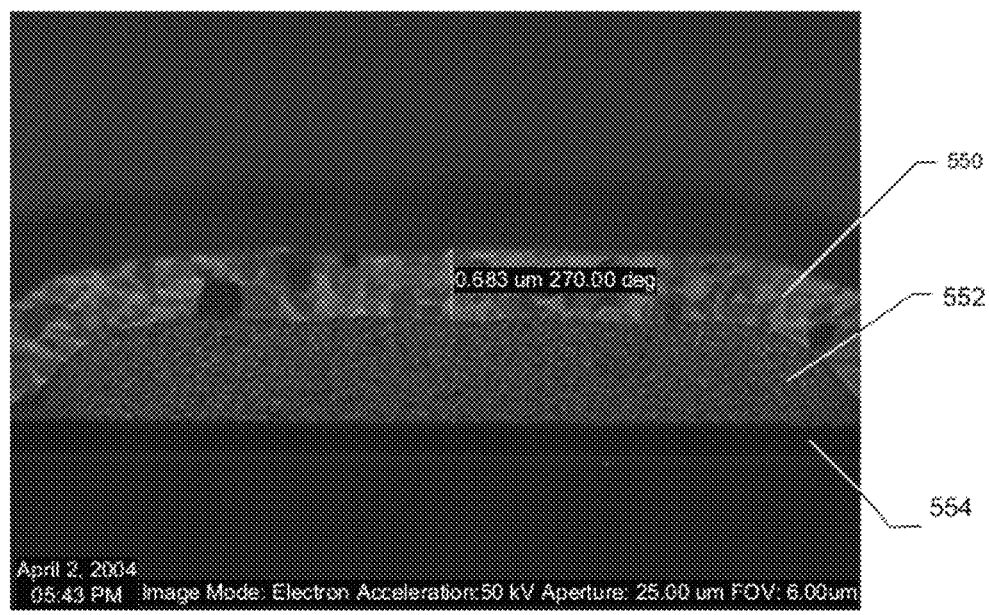
FIG. 5 shows a copper conductor deposited on a seed layer of copper deposited using a focused ion beam in accordance with an embodiment of the invention.

FIG. 5 shows a 0.6 μm thick electroplated copper film 550 deposited on a FIB-deposited copper film 552 about 0.3 μm thick, used as a seed layer on the surface 554 of a work piece. The resistivity of the plated copper line is 2.6 μΩ-cm, indicating a pure state of copper metal. A seed layer could also be applied using "electroless" deposition, using known compounds that are used as seed layers in other processes.

Reversing the polarity of the electrochemical circuit, that is, connecting the copper area of the device to the anode of the current supply, results in the removal of copper from the work piece. A suitable electrolyte for this purpose comprises an aqueous solution containing about 15% copper sulfate and about 5% sulfuric acid by volume, with ENTHONE ViaForm® Accelerator added at about 5 mL/L and ENTHONE ViaForm® Suppressor added at about 2 mL/L.

Figure 6:
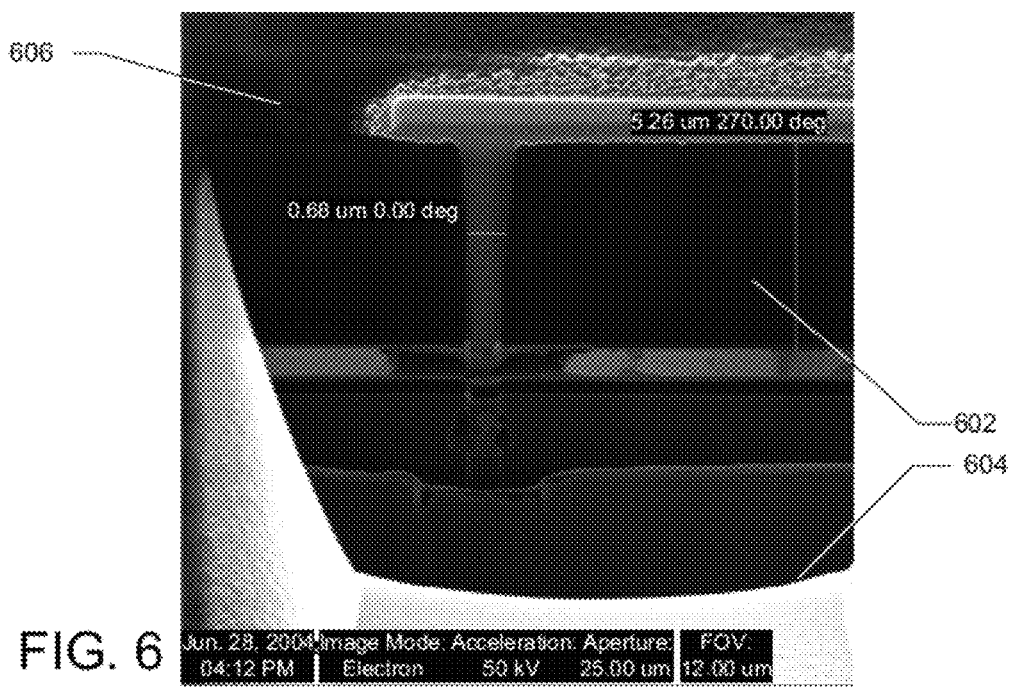
FIG. 6 shows a conductor from which copper was removed in accordance with an embodiment of the invention.

FIG. 6 shows the effect of reversing the polarity of the electrodes. Copper from a buried line 602 has been cleanly removed, leaving the liner material 604. FIG. 6 shows the copper underlayer electrochemically dissolved by anode stripping. The via 606 was then refilled with FIB-deposited tungsten to improve the image quality.

Vias 402 (FIGS. 4) and 606 (FIG. 6) were formed using a charged particle beam to access buried conductors prior to the electrochemical processing steps. Subsequent to the processing in FIG. 2, it is often necessary to process the work piece further using a charged particle beam. It would be efficient to be able to perform the electrochemical processing in the charged particle beam system. Most charged particle beam systems require a high vacuum to operate. For example, a pressure of less than $10^{-4}$ is typically required. In such a vacuum, however, an aqueous electrolyte would rapidly evaporate, making the electrochemical processing difficult or impossible. Moreover, the evaporated electrolyte would raise the pressure in the system preventing operation of the charged particle beam until the system is evacuated again to a high vacuum. By using electrolytes having minimal vapor pressure, however, one could perform the electrochemical processing in a high vacuum, making it possible to rapidly switch between performing electrochemical processes and charged particle beam processes.

One type of electrolyte that can be used in a high vacuum are ionic liquids, also sometimes referred to called "neoteric solvents." Ionic liquids are generally binary mixtures of weakly-attracting cations and anions that exist in liquid phase over a broad temperature range (~300° C.), including ambient or near-ambient temperatures. They typically exhibit near-zero vapor pressure, low viscosity, and high solubility, for a variety of organic, inorganic, and polymeric materials. As room-temperature liquid charge carriers, ionic liquids have nearly unlimited potential in solvent, catalysis, and electrochemical applications. Hundreds of ionic liquids are currently available and/or easily synthesized; some examples are listed below in Table I.

TABLE I

Examples of Ionic Liquids

| Name | Formula | Formula Weight |
| --- | --- | --- |
| 1-butyl-3-methylimidazolium chloride/aluminum chloride | $[C_8N_2H_{15}]^+[AlCl_4]^-$ | 308.01 |
| 1-butyl-3-methylimidazolium hexafluorophosphate | $[C_8N_2H_{15}]^+[PF_6]^-$ | 284.20 |
| 1-butyl-3-methylimidazolium tetrafluoroborate | $[C_8N_2H_{15}]^+[BF_4]^-$ | 226.04 |

Figure 7:
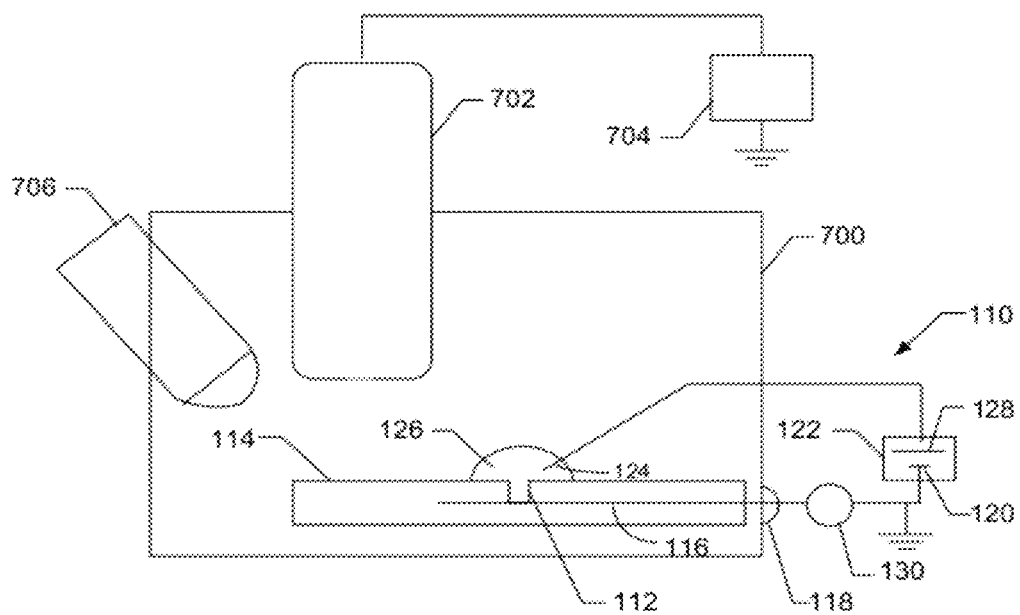
FIG. 7 shows an embodiment of the invention that includes a vacuum system.

FIG. 7 shows the system 110 of FIG. 1 being used in a vacuum chamber 700 including a charged particle beam column 702 including a high voltage power supply 704 and a secondary particle detector 706, such as an Everhart-Thornley detector. The charged particle beam column 706 could be, for example, a focused or shaped ion beam column, or an electron beam column. In embodiments in which the electrochemical reaction is performed in a vacuum chamber, particularly one using a high vacuum, it is preferably to use an electrolyte having low volatility. For example, the electrolyte could be an ionic fluid, as described above. The electrolyte could also be a polymer, such as Poly(vinylidene fluorite) mixed with Cesium hydrogen sulfate (CsHSO4/PVDF). The electrolyte could also be a solid, such as RdAg4I5, which is an ionic conductor. In the embodiment of FIG. 4, the charged particle beam can be used to mill holes in the work piece or to selectively deposit a conductive material as a seed layer onto the work piece to prepare for the electrochemical reaction. The beam does not participate in the electrochemical reaction itself.

Figure 8:
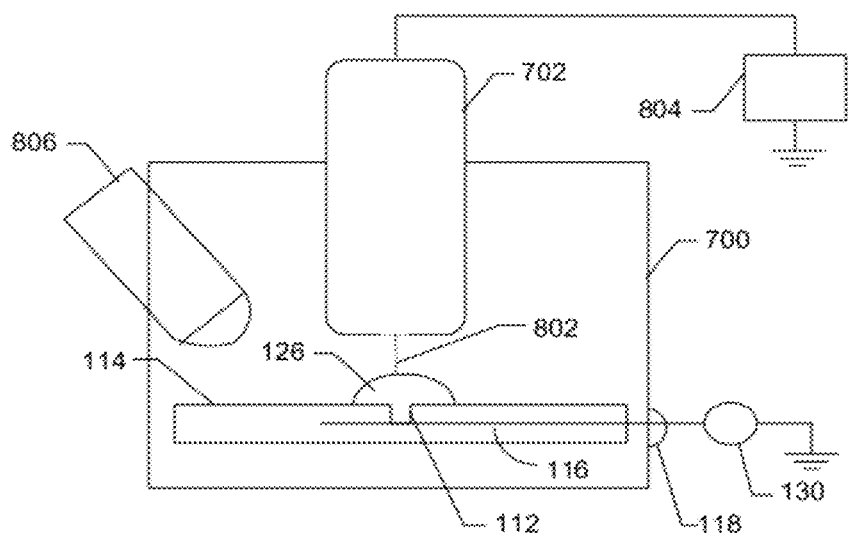
FIG. 8 shows an embodiment of the invention that includes a vacuum system similar to that of FIG. 7, but with a charged particle beam providing current for an electrochemical reaction.

FIG. 8 shows a system similar to that of FIG. 7, but a charged particle beam 802 induces the electrochemical reaction. If charged particle beam 802 is a focused ion beam, it supplies positive ions inducing anodic chemical reactions, resulting in cathodic reactions at the workpiece and causing deposition onto the workpiece. The ion beam also ejects secondary electrons, which can further contribute to the current into the work piece. If charged particle beam 802 is an electron beam, the beam may induce either cathodic or anodic reactions, depending upon the beam operating conditions, particularly the accelerating voltage. If the electron beam induces cathodic reaction, anodic reactions and consequent etching result at the workpiece. If the electron beam induces anodic reactions, cathodic reactions will occur at the workpiece, resulting in deposition.

Figure 9:
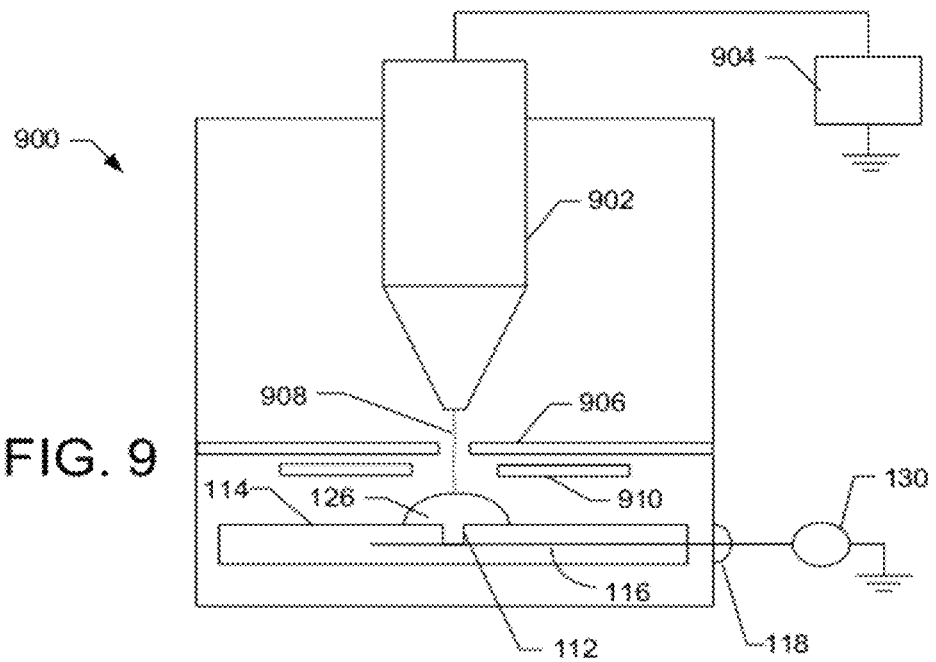
FIG. 9 shows an embodiment of the invention that uses a low vacuum electron beam system.

FIG. 9 shows another embodiment of the invention used in a charged particle beam vacuum chamber. The system of FIG. 9 solves the problem of using electrochemistry in a charged particle beam system in another way. FIG. 9 shows a low vacuum SEM 900, such as the ESEM from FEI Company. One such system is described in U.S. Pat. No. 6,365,896 to van der Mast and typically operates at pressures of between 0.05 Torr (6.5 N/m²) and 20 Torr (2630 N/m²). Because such systems operate at higher pressures than other charged particle systems, the system of FIG. 9 could use an aqueous electrolyte, as the higher vapor pressure can be accommodated in the vacuum chamber without interfering with the operation of the charged particle beam. System 900 includes an electron beam column 902, a power supply 904, and a pressure limiting aperture plate 906 that maintains a low pressure over most of the path of an electron beam 908 and a higher pressure near work piece 114. A particle detector 910 detects secondary electrons, which are amplified by ionizing the gas between the work piece and the detector. While FIGS. 7 and 9 show the current for the electrochemical reaction being supplied by the charged particle beam, the current could also be supplied by a wire or other metallic probe, as shown in FIGS. 1 and 6.

Figure 10:
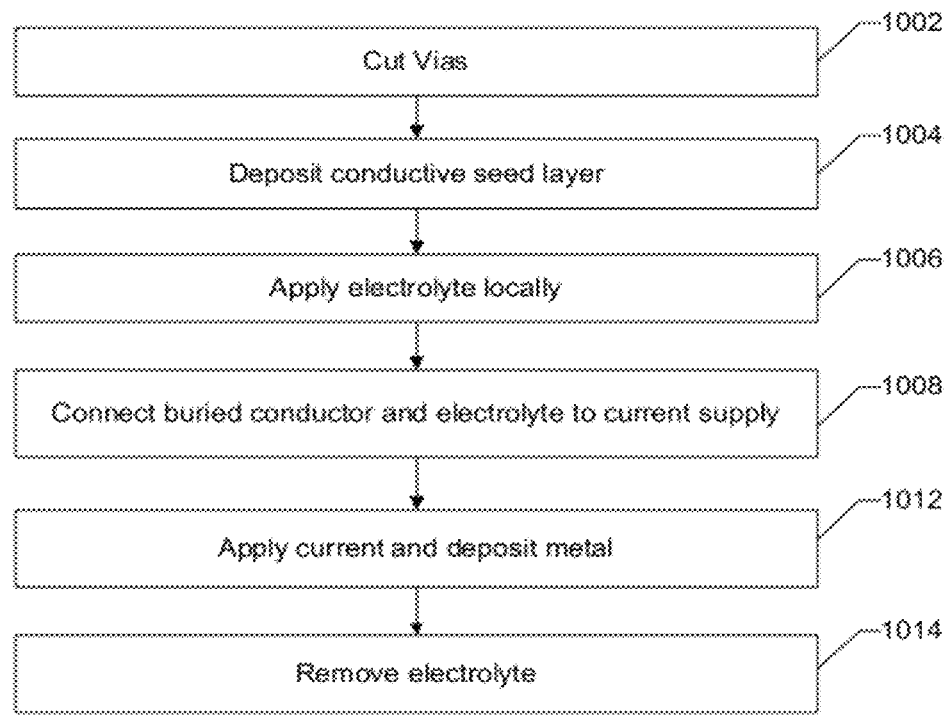
FIG. 10 is a flow chart of a preferred method of making an electrical connection between two buried conductors.
Figure 11A:
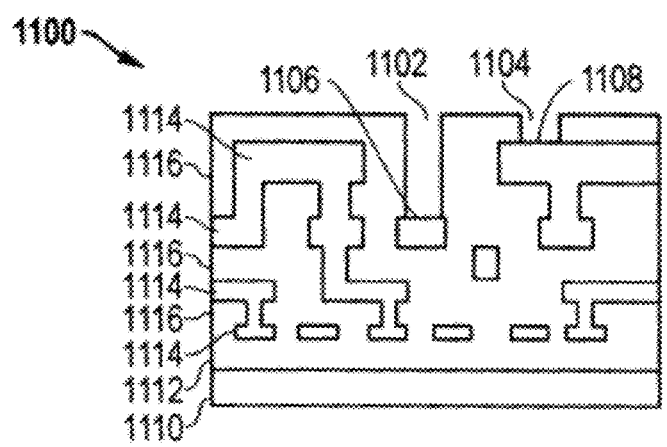
FIGS. 11A-11E shows an integrated circuit undergoing the process described in the flowchart of FIG. 10.

FIG. 10 shows the steps of a circuit edit process for creating a new connection between two buried conductors. FIGS. 11A-11F shows the circuit during the various steps of FIG. 10. In step 1002, vias 1102 and 1104 are cut in an integrated circuit 1100 using a charged particle beam to expose a buried conductor 1106 and 1108 as shown in FIG. 11A. Integrated circuit 1100 includes a layer of silicon 1110 on which is deposited an insulating layer 1112, and then a series on conducting layers 1114 separated by insulating layers 1116. Most of the conductive layers are patterned to form conductors between points on the circuit.

Figure 11B:
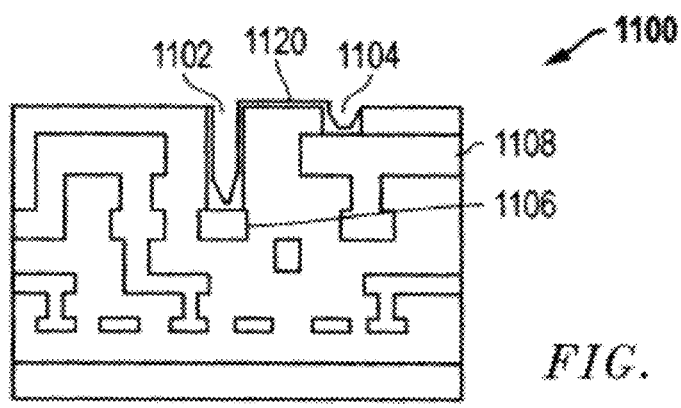

FIG. 11B shows that a thin layer 1120 of copper is deposited in the vias and along a path connecting the vias in step 1004 using FIB-induced deposition to provide a seed layer for later electrochemical deposition. In some cases, such as filling a single, low aspect ratio hole connecting to a buried conductor, it may be possible to skip the FIB deposited copper and electrodeposit directly on the buried conductor to fill the hole. Skilled persons can readily determine when the FIB-deposited copper is necessary to produce a completed filled via, with no voids.

Figure 11C:
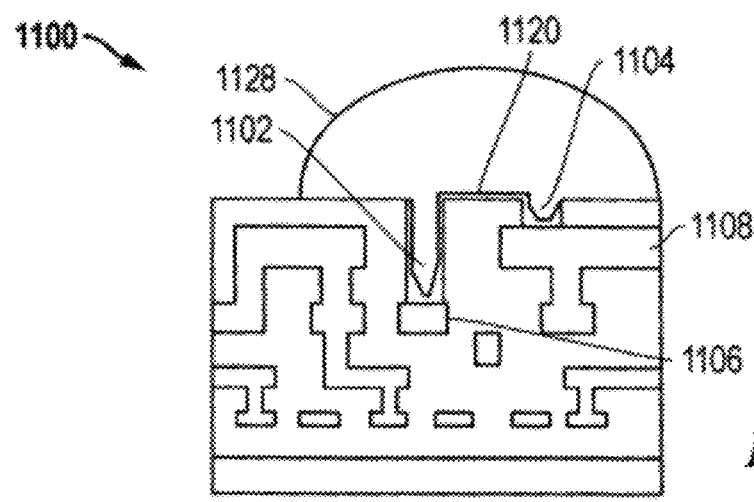
Figure 11D:
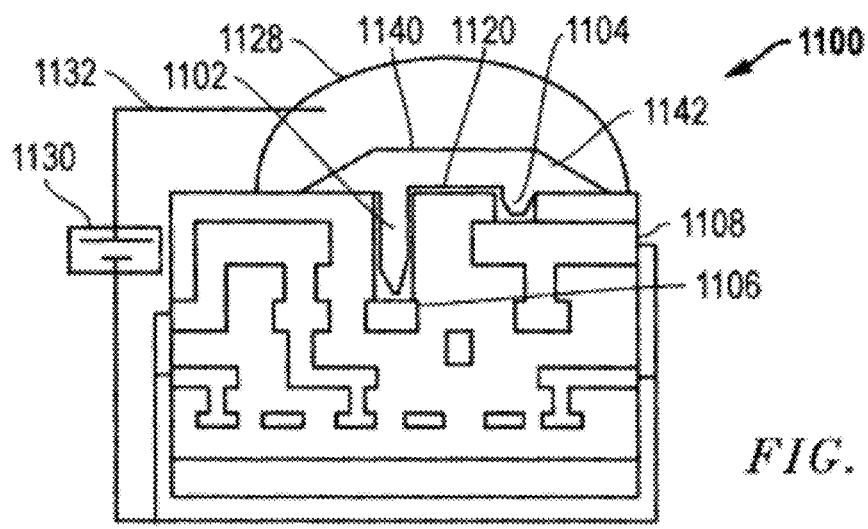
Figure 11E:
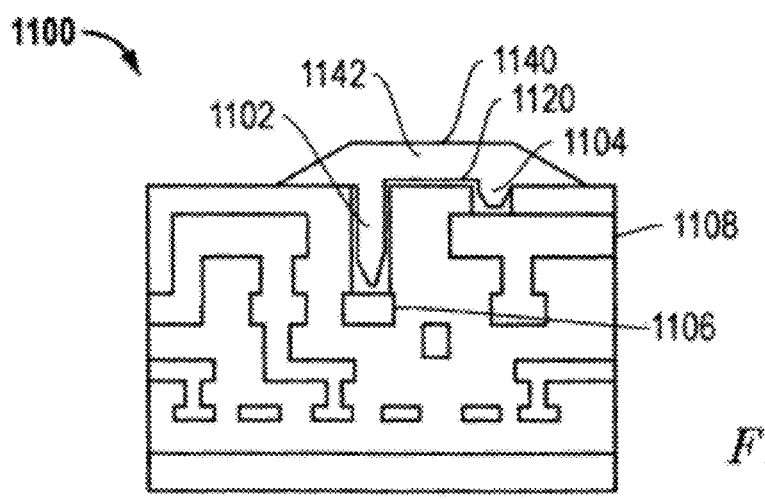

In step 1006, a drop of electrolyte 1128 is applied to the circuit, filling the via and covering the area between them as shown in FIG. 11C. An example of a suitable electrolyte for copper deposition is described above with respect to FIG. 2. In step 1008, the buried conductors 1106 and 1108 are connected to the anode of a current source 1130. As described above, the contact can be made through the pins of the IC or through another area of the circuit that is electrically connected to conductors 1106 and 1108. Also in step 1008, a copper wire 1132 that is electrically connected to the cathode of the power supply is contacted to the electrolyte 1128, as shown in FIG. 11D. In step 1012, current is applied and copper 1140 is deposited onto seed layer 1120 to fill vias 1102 and 1104 and to create an electrical path 1142 between the vias to electrically connect buried connectors 1108 and 1106. FIG. 11E shows that deposited copper 1140 with the remaining electrolyte 1128 removed. If an aqueous electrolyte is used, the remaining electrolyte can be removed by rinsing with water. Otherwise, a suitable solvent is used to rinse away the remaining electrolyte.

Figure 12:
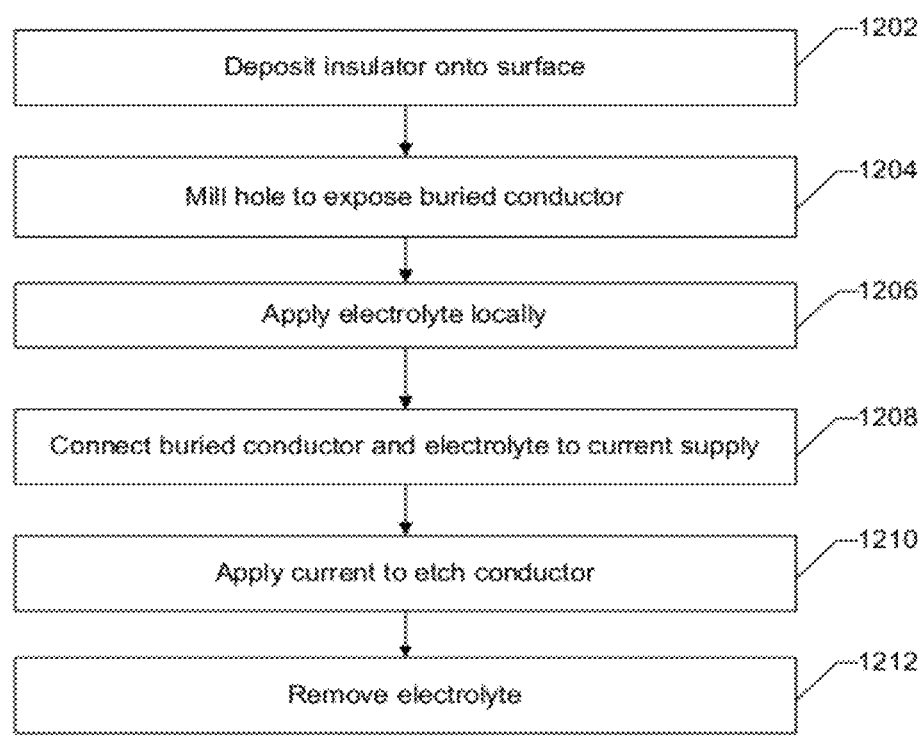
FIG. 12 is a flow chart of a preferred method of severing a buried conductor.
Figure 13A:
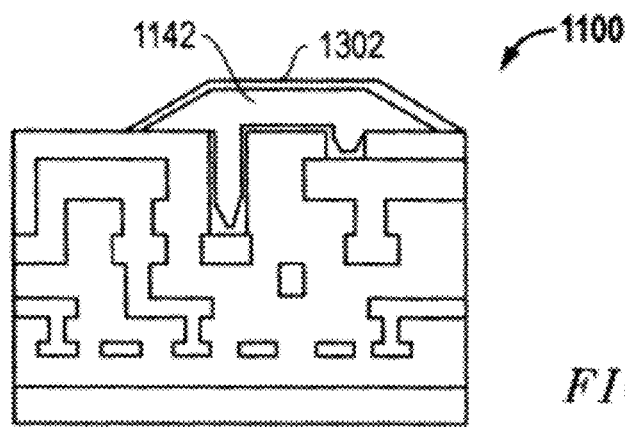
FIG. 13A-13E shows an integrated circuit undergoing the process described in the flowchart of FIG. 12.
Figure 13B:
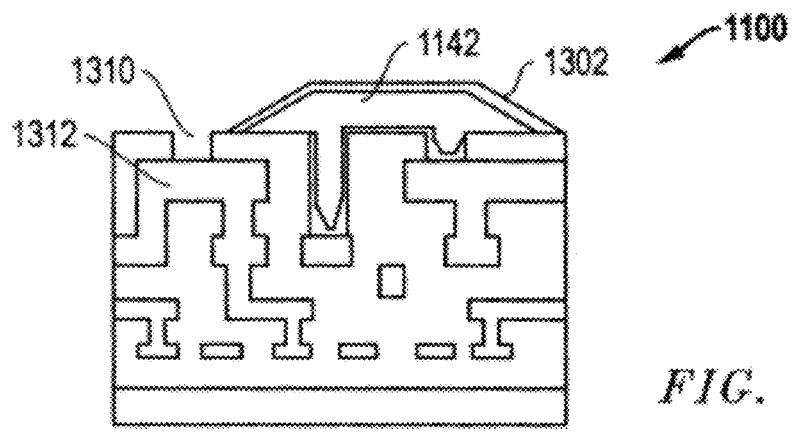
Figure 13C:
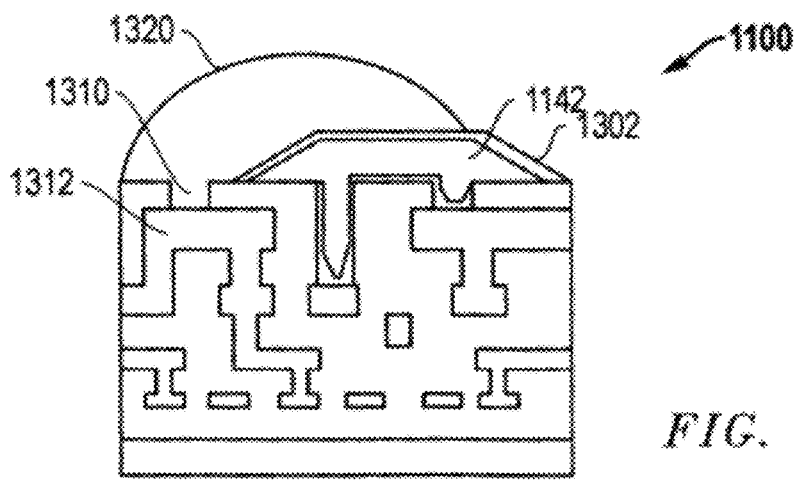

FIG. 12 shows a preferred process for severing a buried electrical connection in integrated circuit 1100. FIGS. 13A through 13F show the circuit 1100 during the processing of the steps of FIG. 12. FIG. 13A shows that in step 1202 an insulator 1302 is deposited, preferably using FIB deposition, to protect electrical connector 1142 previously deposited as described above with respect to the process of FIG. 10. Any exposed conductive or semiconductive material should be covered with an insulating material to prevent inadvertent etching during subsequent processing. In step 1204, a via 1310 is milled using a focused ion beam or laser to expose buried conductor 1312 as shown in FIG. 13B. In step 1206, an electrolyte 1320 is deposited onto circuit 1100 so that the electrolyte fills via 1310, as shown in FIG. 13C.

Figure 13D:
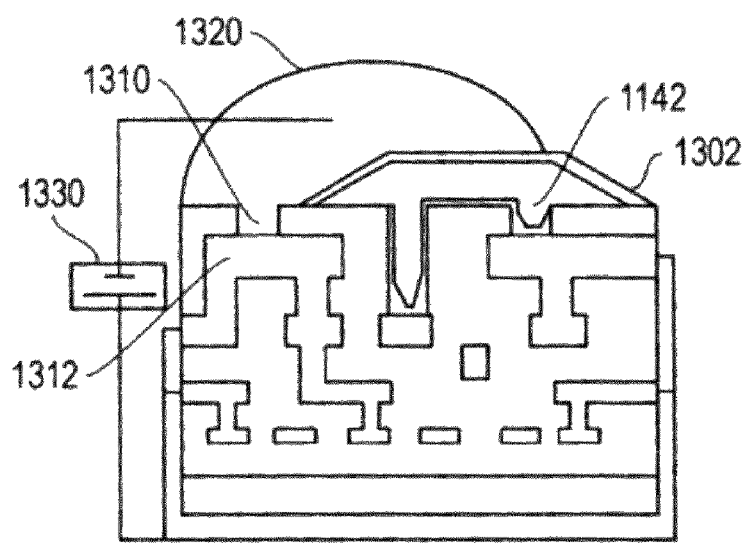
Figure 13E:
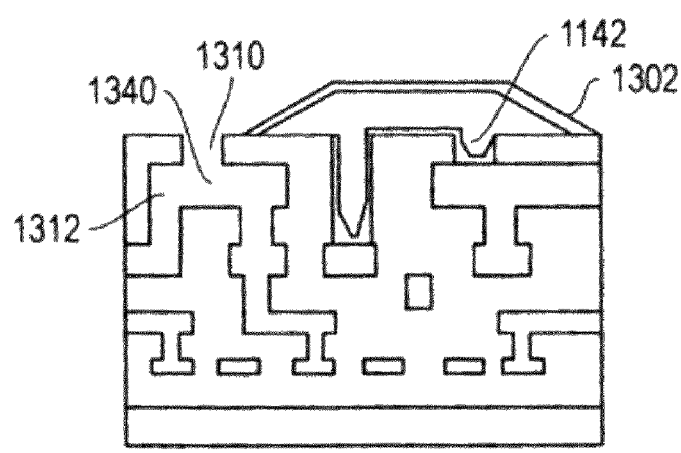

In step 1208, an electrical connection is made to from the anode of the current source 1330 to the electrolyte 1320 and from the cathode of the current source 1330 to the buried conductor 1312 as shown in FIG. 13D. As described above, the connection may be made through pins in the circuit via other conductors and semiconductors in the circuit. As current is applied in step 1210, copper is removed from the buried conductor by electrochemical etching. FIG. 13E shows the result of the operation, with the electrolyte 1320 removed. Unlike using a FIB process to sever the connection, using electrochemical processing will not overmill into the layer below the layer being severed. Etched area 1340 has been removed from conductor 1312, severing the electrical connection.

To determine the point at which to stop the current flow, one can determine the total charge required to process the volume of copper that needs to be removed to sever the circuit, and cease processing when that amount of current has moved through the circuit. One could also determine the end point by observing the amount of current flowing though the circuit, which is roughly proportional to the area of exposed copper. The current will vary during the etching process and can be characterized to determine when etching is complete, in a manner similar to the characterization shown in FIG. 3 for an electrodeposition process.

Figure 14:
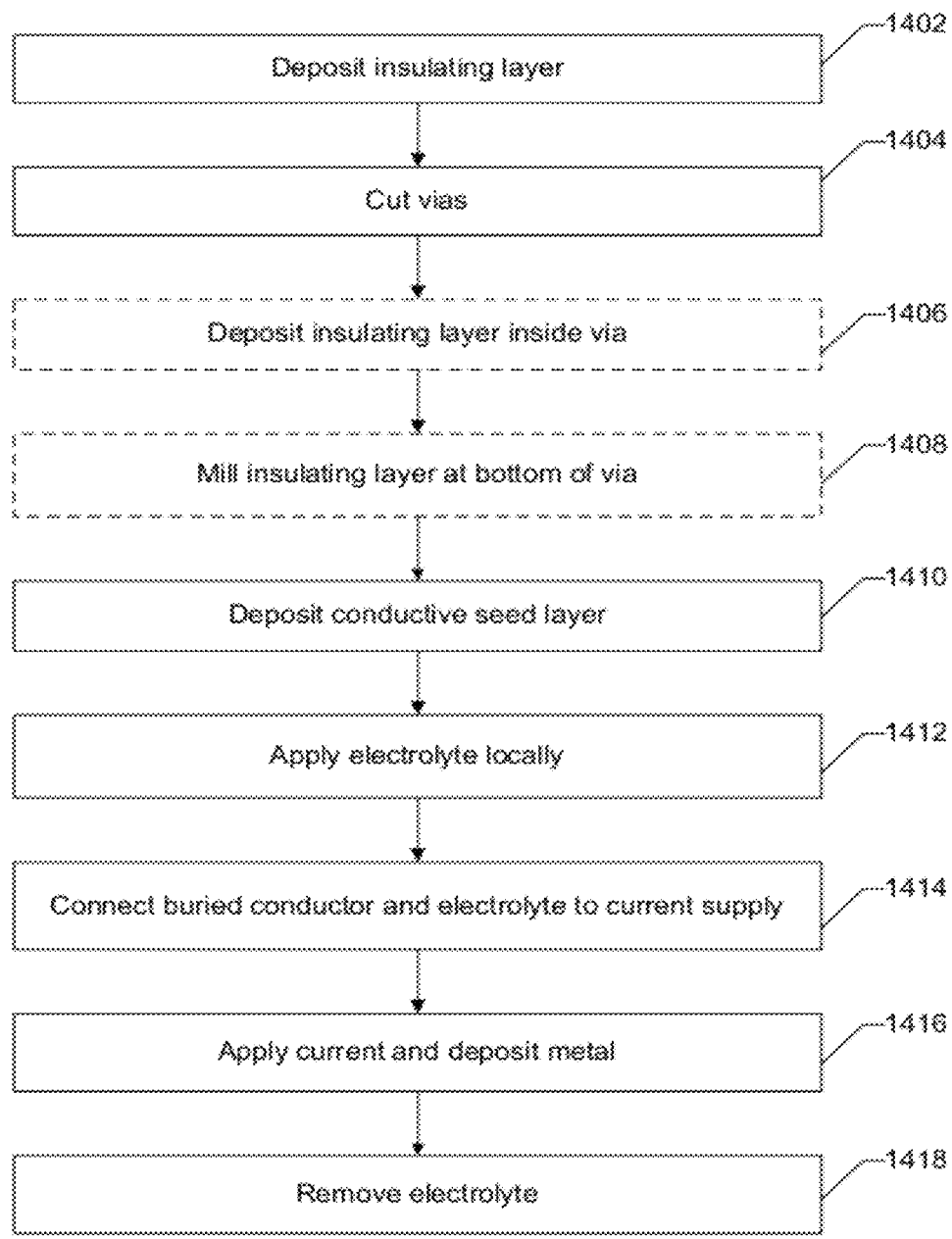
FIG. 14 is a flow chart of a preferred method of making an electrical connection between two buried conductors in a flip-chip.

FIG. 14 shows a circuit edit process for connecting two buried conductors. The process of FIG. 14 is similar to that described in FIG. 10, but the work piece is a "flip chip," that is, an integrated circuit that is mounted upside-down onto a package, so that during the circuit edit process, one approaches the conductive layers from the back side of the chip, rather than from the front side. A conventional chip approached from the front side typically has an insulating layer on top. A flip chip, approached from the back side, will typically have a semiconducting layer on top. Because the semiconducting layer conducts electricity and can participate in electrochemical processes, additional steps are required to protect the semiconducting layer.

Figure 15A:
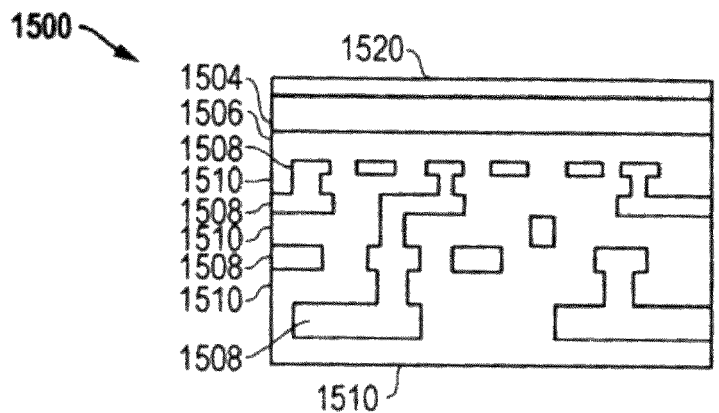
FIGS. 15A-15H shows a flip chip integrated circuit undergoing the process described in the flowchart of FIG. 14.

FIG. 15A-15H shows an integrated circuit 1500 during the various processes steps of FIG. 14. As shown in FIG. 15A, the integrated circuit 1500 consists of a layer of silicon 1504, an insulating layer 1506, and then several conducting layers 1508 separated by insulating layers 1510.

Figure 15B:
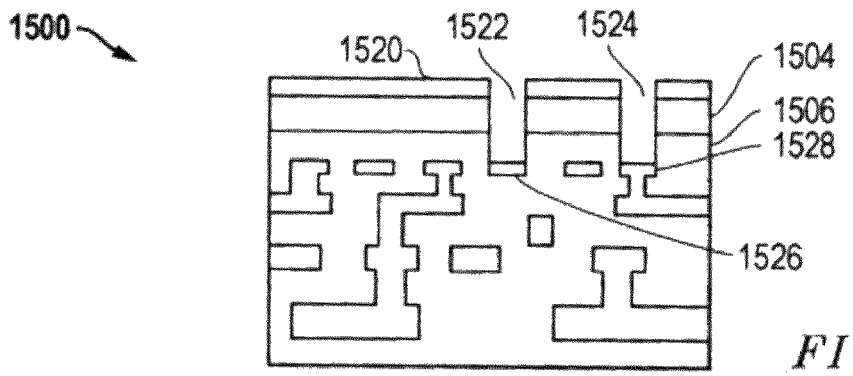

In step 1402, an insulating layer 1520, as shown in FIG. 15A, is deposited using FIB-induced deposition, chemical vapor deposition, or other process. The insulating layer is required because the silicon can be sufficiently conductive to participate in the electrochemical process, which would undesirably result in copper being deposited on the entire back side of the circuit. The insulating layer should cover the entire area that will be contacted by the electrolyte. In step 1404, vias 1522 and 1524 are milled through the insulating layer 1520, the silicon layer 1504, and insulating layer 1506 to expose buried conductors 1526 and 1528 as shown in FIG. 15B.

Figure 15C:
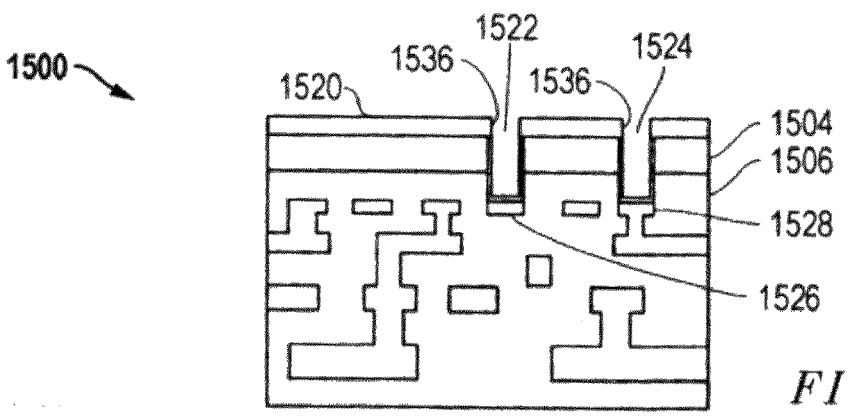
Figure 15D:
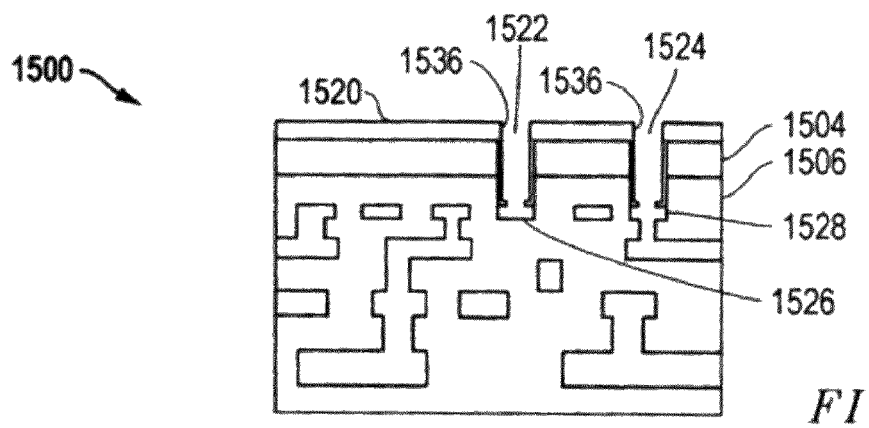

In optional step 1406, an insulating layer 1536 is deposited on the walls of vias 1522 and 1524 to insulate the silicon layer 1504. The insulating layer 1536 is shown in FIG. 15C and is necessary in applications in which high isolation from the silicon substrate is required. Unfortunately, the insulating layer will also coat the bottom of vias 1522 and 1524, insulating buried conductors 1526 and 1528. In step 1408, a charged particle beam is used to remove the insulating layer 1536 at the bottom of the vias on buried conductors 1526 and 1528 as shown in FIG. 15D.

Figure 15E:
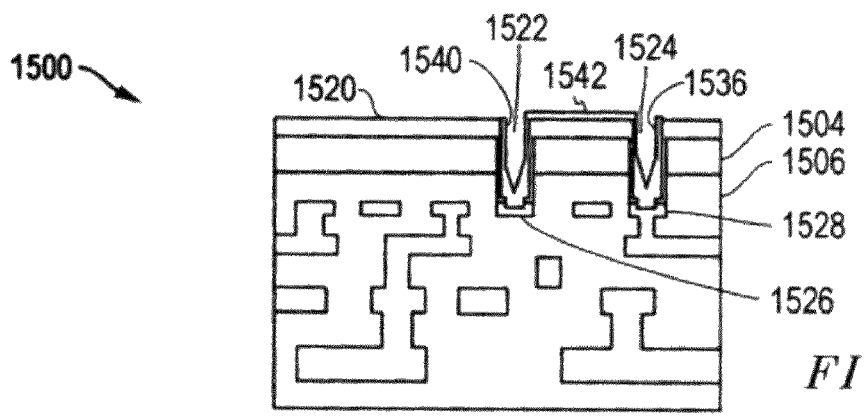
Figure 15F:
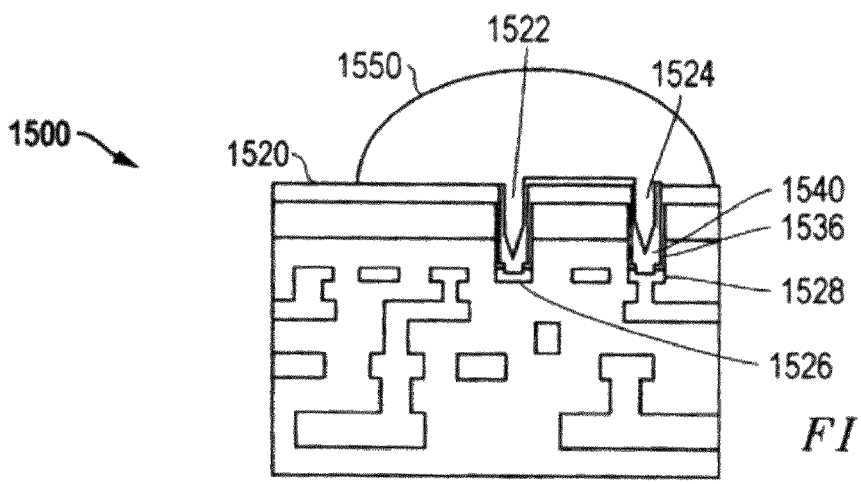

In step 1410, a conductive material 1540 is deposited using charged particle beam induced deposition onto the bottom and side walls of vias 1522 and 1524 and on insulating layer 1520 to produce a conductive path 1542 between the vias as shown in FIG. 15E. The deposited material may be, but does not need to be, the same material that will be electrodeposited to fill the vias and form the conductive path between them. For example, in some embodiments, either copper or tungsten may be deposited in step 1410, and then the vias filled with electrodeposited copper. In step 1412, an electrolyte 1550, such as drop of aqueous liquid, ionic liquid or polymer, is place locally onto the surface and in the vias as shown in FIG. 15F.

Figure 15G:
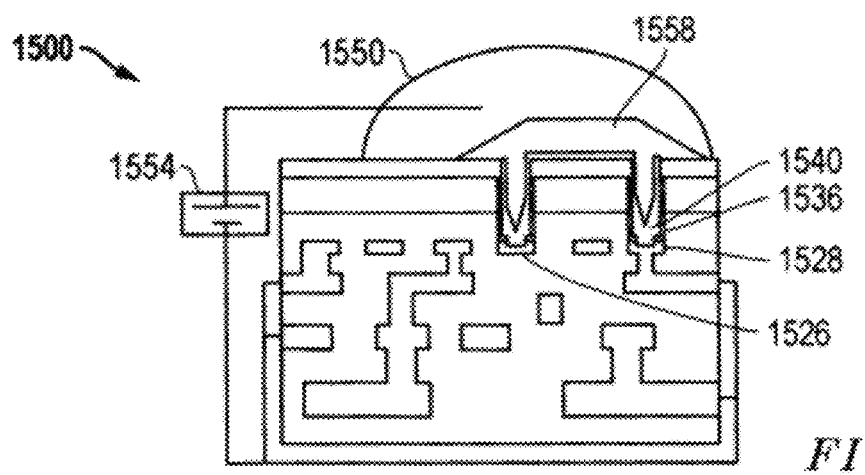
Figure 15H:
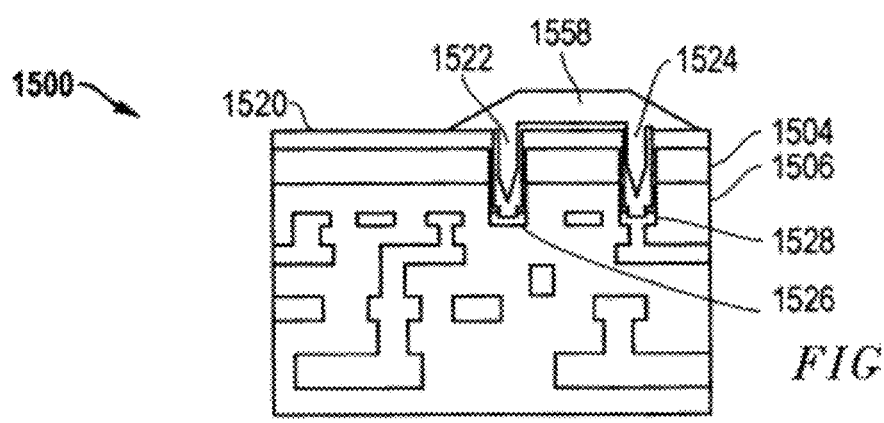

In step 1414, the buried conductors 1526 and 1528 are electrically connected to the anode of a current supply 1554 and the electrolyte 1550 is electrically connected to the cathode of the current supply 1554 as shown in FIG. 15G. As described above, the connections to buried conductors 1526 and 1528 are typically directly or indirectly through pins (not shown) of integrated circuit 1500. In step 1416, a current is passed through the electrochemical circuit formed by the current supply 1550, the electrolyte, the charged particle beam deposited conductor 1540, buried conductors 1526 and 1528, and back to current supply 1550. The current passing through electrolyte 1550 deposits a metal 1558 in the vias and on the surface between the vias. The current supply is stopped when the vias are filled and a conductive path created between the vias. As described above, one can determine when sufficient metal has been deposited by observing the change in the amount of current flowing through the electrochemical circuit. In step 1418, the electrolyte is removed. FIG. 15H shows that the new electrical connection that between the buried conductors is now complete.

Figure 16:
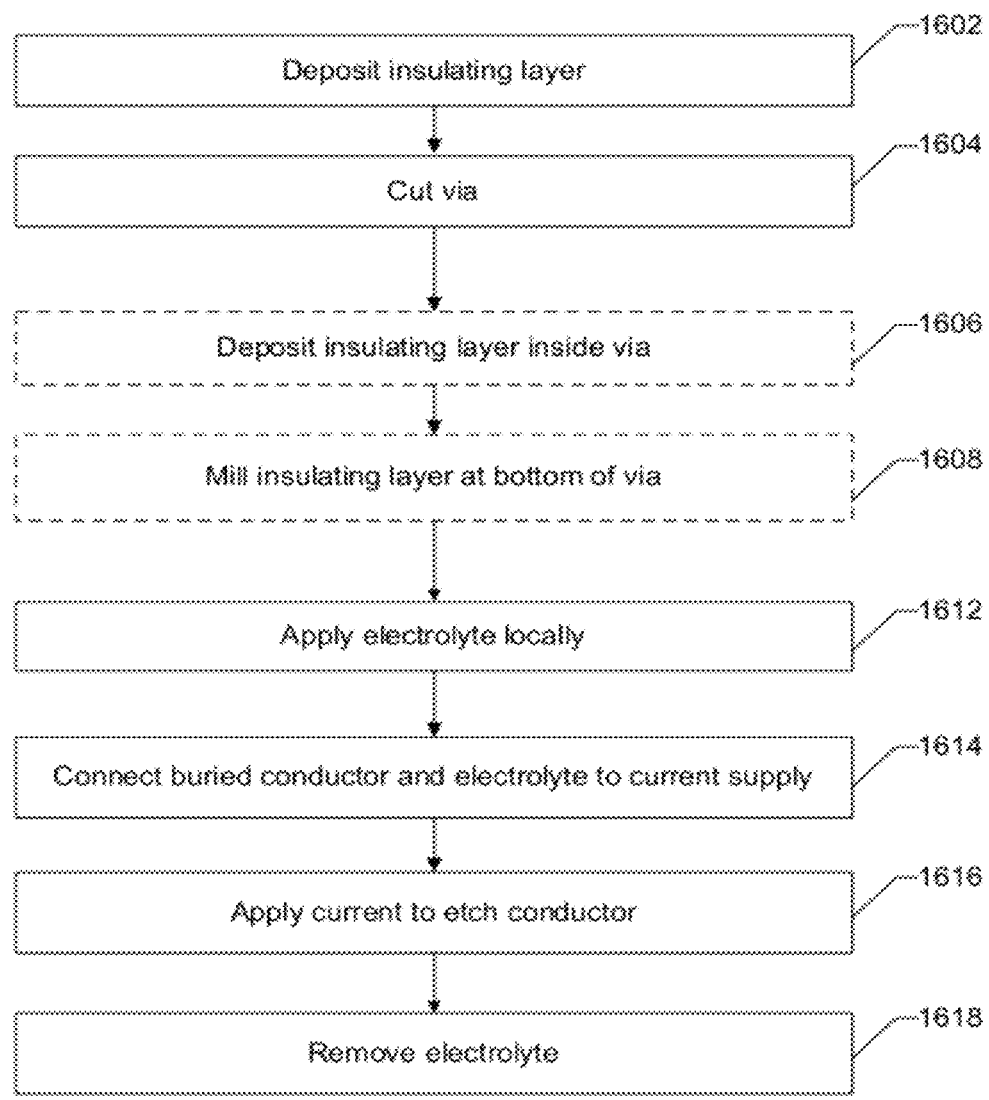
FIG. 16 is a flow chart of a preferred method of severing a buried conductor in a flip chip.
Figure 17A:
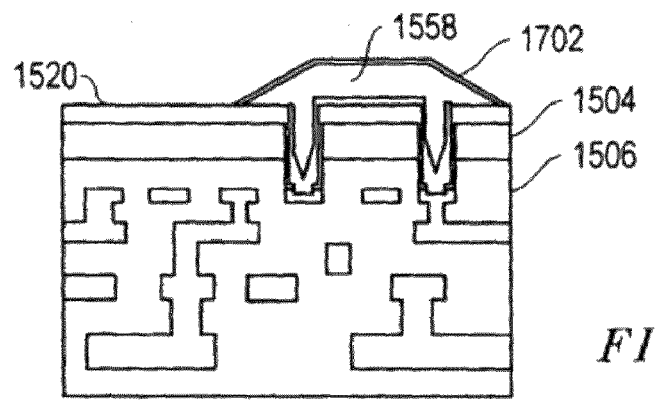
FIG. 17A-17G shows an integrated circuit undergoing the process described in the flowchart of FIG. 16.
Figure 17B:
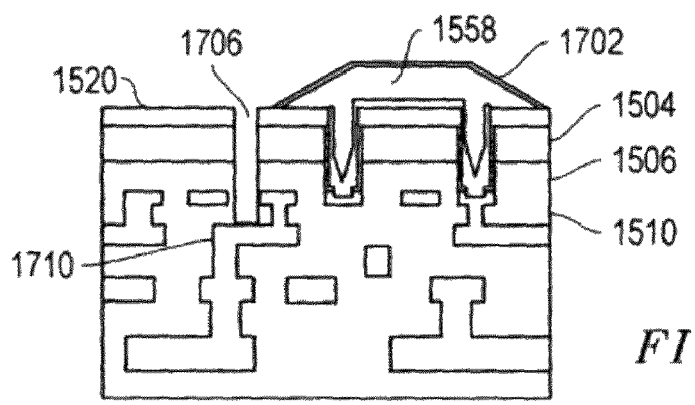
Figure 17C:
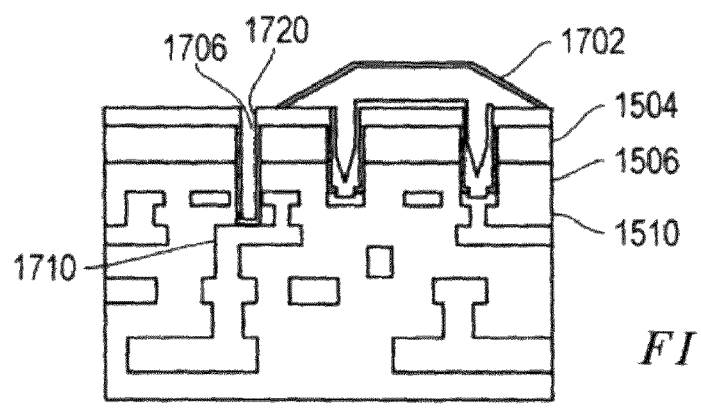
Figure 17D:
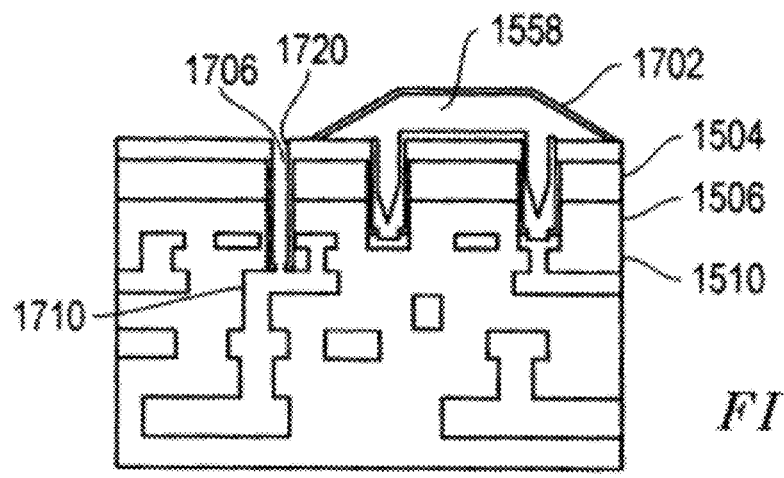

FIG. 16 is a flow chart showing the steps of a preferred method for severing a buried electrical connection in flip chip integrated circuit 1500. FIGS. 17A-17G show integrated circuit 1500 at various stages of the process described in FIG. 16. In step 1602, an insulating layer 1702, as shown in FIG. 17A, is deposited using charged particle beam assisted deposition over the conductor 1558 deposited previously in accordance with the method of FIG. 14. In step 1604, a via 1706 is milled as shown in FIG. 17B, using a charged particle beam or laser through insulating layer 1520, silicon layer 1504, insulating layer 1506 and insulating layer 1510 to expose the buried conductor 1710 to be severed. In optional step 1606, an insulating layer 1720, shown in FIG. 17C, is deposited to protect the silicon layer 1504 on the exposed sidewalls of via 1706. If high insulation from the silicon substrate is not required, steps 1606 and 1608 can be omitted. Step 1606 will also typically deposit insulating material onto buried conductor 1710 at the bottom of via 1706. In step 1608, a charged particle beam or laser is used to remove the insulation 1720 deposited onto the conductor 1710, thereby exposing buried conductor 1710 again as shown in FIG. 17D.

Figure 17E:
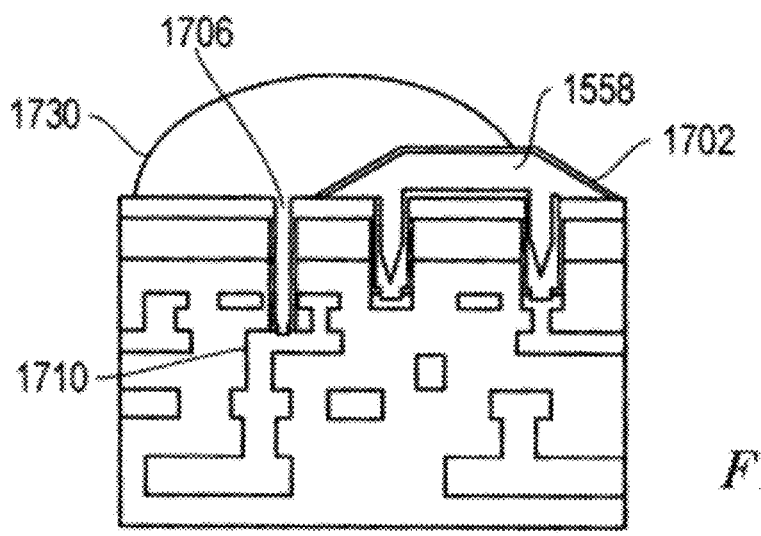
Figure 17F:
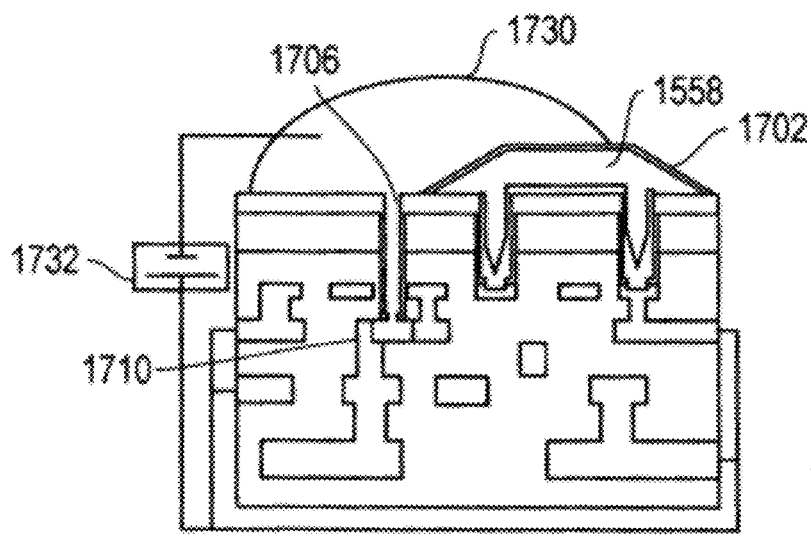

In step 1612, an electrolyte 1730 is deposited into via 1706 and onto the adjacent area, as shown in FIG. 17E. In step 1614, the anode of a current source 1732 is connected to the electrolyte 1730 and the cathode of the current source 1732 is connected directly or indirectly to buried conductor 1710, the connection being made as described above. The connection is preferably made from both sides of the connection to be severed, so that the etching occurs symmetrically. In step 1616, current is applied through the electrochemical circuit to remove the copper or other metal making up conductor 1710, thereby severing the electrical conductor that was being made by conductor 1710. In step 1618, the electrolyte is removed.

Figure 17G:
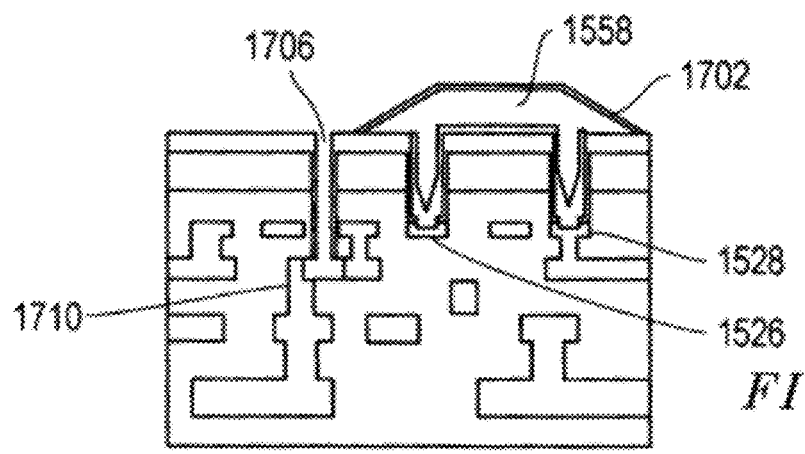

FIG. 17G shows the circuit 1500 with the electrolyte removed and the circuit editing complete. Conductor 1710 has been severed, and conductors 1526 and 1528 have been connected.

While the examples above described etching and depositing copper, the invention is not limited to copper. Other metals such as W, Au, Pt, Pd, Ag, Ni, Cr, Al, Ta, Zn, Fe, Co, Re etc and alloys composed of these metals can also be used.

The invention deposits substantially pure metals, so the resistivities are comparable to those of pure metals, for example less than 100 μΩ-cm, more preferably less than 50 μΩ-cm, even more preferably less than 25 μΩ-cm or less than 10 μΩ-cm, and most preferably less than 5 μΩ-cm. The deposited metals can be greater than 90% (atomic percent) pure, more preferably greater than 95% pure and most preferably greater than 99% pure. Alloys could be deposited using solutions containing multiple metal ion species.

While the invention is described in connection with circuit editing, it can be used to modify any structure and is not limited to any particular application. Also, the technique is not necessarily limited to depositing and etching conductors—charge transfer may also be used to deposit or remove polymer materials. The local electrochemical processes can be used on any surface to which an electrolyte can flow, and it is not limited, like beam processing, to processing along a line of sight from the beam source.

The term "contact" or "electrical contact" as used herein includes direct and indirect connections. While the invention is described primarily in terms of depositing or etching metals, the invention can be used to deposit or etch any material having sufficient conductivity to participate in electrochemical reaction.

The invention has multiple aspects that are separately patentable and not all aspects will be used in all embodiments.

Although the present invention and its advantages have been described in detail, it should be understood that various changes, substitutions and alterations can be made herein without departing from the spirit and scope of the invention as defined by the appended claims. The scope of the present application is not limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A system for modifying a small structure on a work piece, comprising:
   a vacuum chamber for containing the work piece;
   a charged particle beam column for directing a charged particle beam toward the work piece, the charged particle beam column having a maximum operating vacuum chamber pressure;
   an applicator for applying an electrolyte onto a portion of the work piece less than the entire work piece in the vacuum, the applicator comprising a pipette, the pressure in the vacuum chamber remaining within the operating range of the charged particle beam.

2. The system of claim 1 in which the maximum operating vacuum chamber pressure is $10^{-4}$ Torr and in which the electrolyte is an ionic liquid.

3. The system of claim 1 in which the charge particle beam system is a low vacuum electron beam system having a maximum operating vacuum chamber pressure of 50 Torr and in which the electrolyte is an aqueous solution.

4. A method of altering a microscopic structure, comprising:
   directing a beam to the microscopic structure to expose a region of a buried conductor in a work piece;
   locally applying an electrolyte to the region of the exposed conductor such that most of the work piece remains dry, the locally applying an electrolyte includes locally applying an electrolyte using a pipette; and
   applying a voltage across the exposed conductor and the electrolyte to deposit or remove material from the conductor by an electrochemical reaction.

5. The method of claim 4 in which applying a voltage across the exposed conductor and the electrolyte to deposit or remove material from the conductor includes applying a negative voltage to the conductor and applying a positive voltage to the electrolyte, the voltage causing material from the electrolyte to deposit onto the conductor.

6. The method of claim 4 in which the conductor comprises copper and in which the material deposited on the conductor is copper.

7. The method of claim 4 in which directing a charged particle beam to the microscopic structure to expose a region of a buried conductor includes milling an access hole and further comprising depositing a seed layer of a conductive material on the sides of the access hole.

8. The method of claim 4 in which the material deposited or removed comprises Cu, W, Au, Pt, Pd, Ag, Ni, Cr, Al, Ta, Zn, Fe, Co, Re, or alloys.

9. The method of claim 4 in which:
   directing a beam to the microscopic structure to expose a region of a buried conductor includes directing a charged particle beam to a microscopic structure on a work piece in a vacuum chamber; and
   locally applying an electrolyte to the region of the exposed conductor includes applying an electrolyte in the vacuum chamber.

10. The method of claim 9 in which the electrolyte is an ionic liquid.

11. The method of claim 9 in which directing a charged particle beam includes directing an electronic beam in a low vacuum electron beam system and in which the electrolyte is an aqueous liquid.

12. A method of depositing a conductor, comprising;
    directing a beam to remove covering material to expose a covered conductor in a work piece;
    applying an electrolyte to the exposed conductor such that most of the work piece remains dry, the applying an electrolyte includes applying an electrolyte using a pipette and
    applying a current through the electrolyte and the exposed conductor to deposit a conductive material onto the exposed conductor.

13. The method of claim 12 in which the conductive material comprises a copper material having a resistivity of less than 50 µohm-cm.

14. The method of claim 13 in which the conductive material comprises a copper material having a resistivity of less than 25 µohm-cm.

15. The method of claim 12 further in which:
    directing a beam to remove covering material to expose a covered conductor further includes directing the beam to remove covering material to expose a second covered conductor;
    applying an electrolyte to the exposed conductor includes applying an electrolyte to the second exposed conductor and to an area between the first and second conductors; and
    applying a current through the electrolyte and the exposed conductor to deposit a conductive material onto the exposed conductor includes applying a current through the electrolyte and the second exposed conductor to deposit a conductive material onto the second exposed conductor.

16. The method of claim 15 further comprising depositing a conductive material onto an area between the exposed conductor and the second exposed conductor before, and in which
    applying an electrolyte to the exposed conductor includes depositing an electrolyte onto the conductive material, and
    applying a current through the electrolyte deposits a second conductive layer to connect the first exposed conductor and the second exposed conductor.

17. The method of claim 12 in which applying an electrolyte and applying a current are performed in a vacuum chamber.

18. The method of claim 17 in which the electrolyte comprises an ionic liquid.

* * * * *